United States Patent
Lee et al.

(10) Patent No.: US 9,496,398 B2
(45) Date of Patent: Nov. 15, 2016

(54) EPITAXIAL SOURCE/DRAIN REGIONS IN FINFETS AND METHODS FOR FORMING THE SAME

(71) Applicant: Taiwan Semiconductor Manufacturing Company, Ltd., Hsin-Chu (TW)

(72) Inventors: Tung Ying Lee, Hsin-Chu (TW); Chen-Han Wang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 175 days.

(21) Appl. No.: 14/156,230

(22) Filed: Jan. 15, 2014

(65) Prior Publication Data

US 2015/0200271 A1    Jul. 16, 2015

(51) Int. Cl.
*H01L 21/8234* (2006.01)
*H01L 21/336* (2006.01)
*H01L 29/78* (2006.01)
*H01L 29/66* (2006.01)

(52) U.S. Cl.
CPC ....... *H01L 29/785* (2013.01); *H01L 29/66795* (2013.01)

(58) Field of Classification Search
CPC ..................................................... H01L 29/785
USPC ......................................................... 438/197
See application file for complete search history.

(56) References Cited

U.S. PATENT DOCUMENTS

| | | | |
|---|---|---|---|
| 2007/0001173 A1* | 1/2007 | Brask | H01L 21/30608 257/67 |
| 2008/0048262 A1* | 2/2008 | Lee | H01L 29/41791 257/347 |
| 2013/0264639 A1* | 10/2013 | Glass | H01L 21/28512 257/335 |
| 2014/0001520 A1* | 1/2014 | Glass | H01L 29/66439 257/288 |
| 2014/0273429 A1* | 9/2014 | Wei | H01L 29/401 438/595 |

\* cited by examiner

*Primary Examiner* — Matthew Landau
*Assistant Examiner* — Igwe U Anya
(74) *Attorney, Agent, or Firm* — Slater Matsil, LLP

(57) ABSTRACT

An embodiment is a structure including a substrate having a fin and an isolation region adjoining the fin, and a raised epitaxial source/drain region on the fin. A first lateral distance is between opposing exterior surfaces of the raised epitaxial source/drain region at an upper portion of the raised epitaxial source/drain region. A second lateral distance is between opposing exterior surfaces of the raised epitaxial source/drain region at a mid portion of the raised epitaxial source/drain region. A third lateral distance is between opposing exterior surfaces of the raised epitaxial source/drain region at a lower portion of the raised epitaxial source/drain region. The first lateral distance is greater than the second lateral distance, and the second lateral distance is less than the third lateral distance.

20 Claims, 12 Drawing Sheets

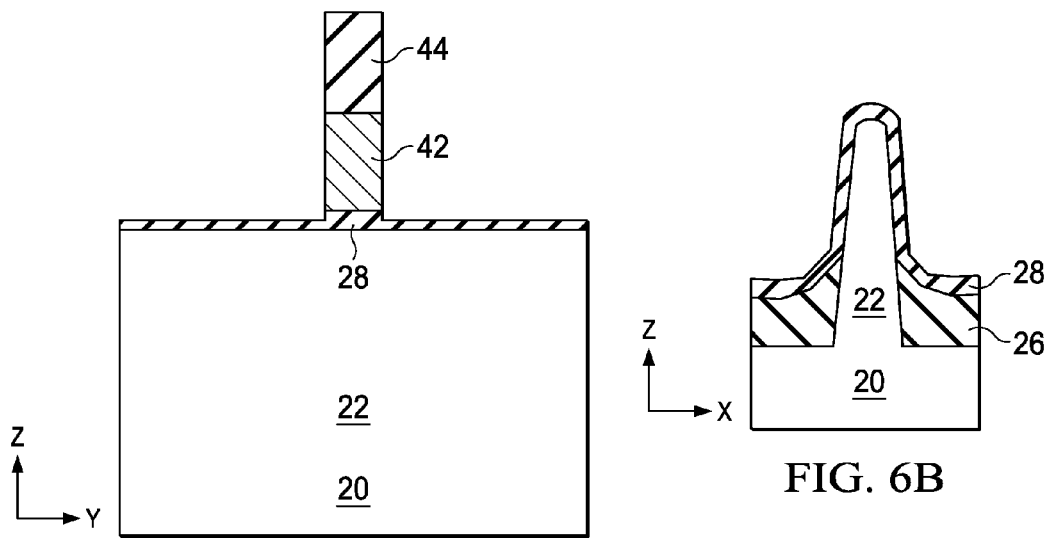
FIG. 6A
FIG. 6B
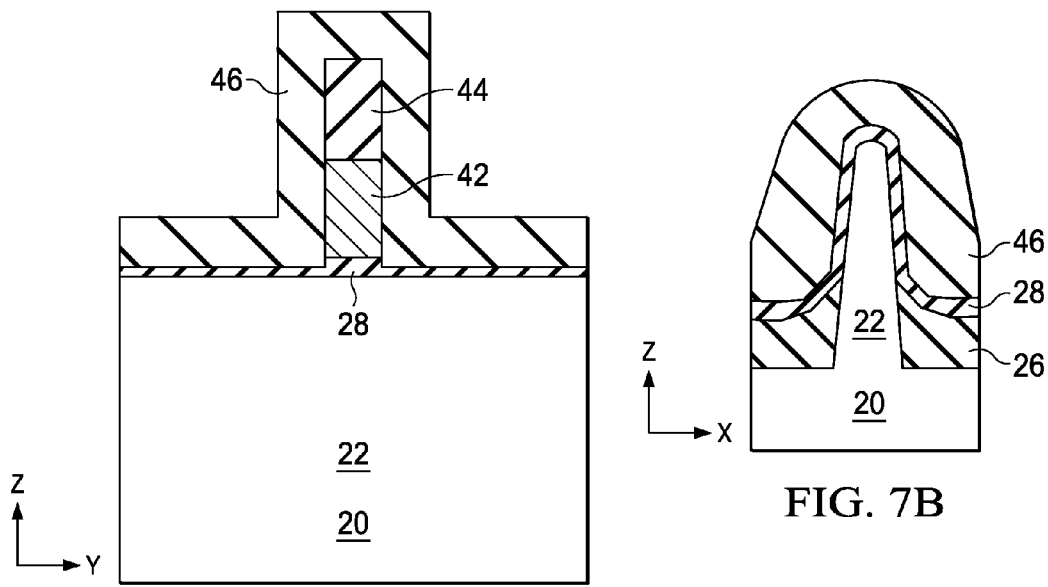
FIG. 7A
FIG. 7B

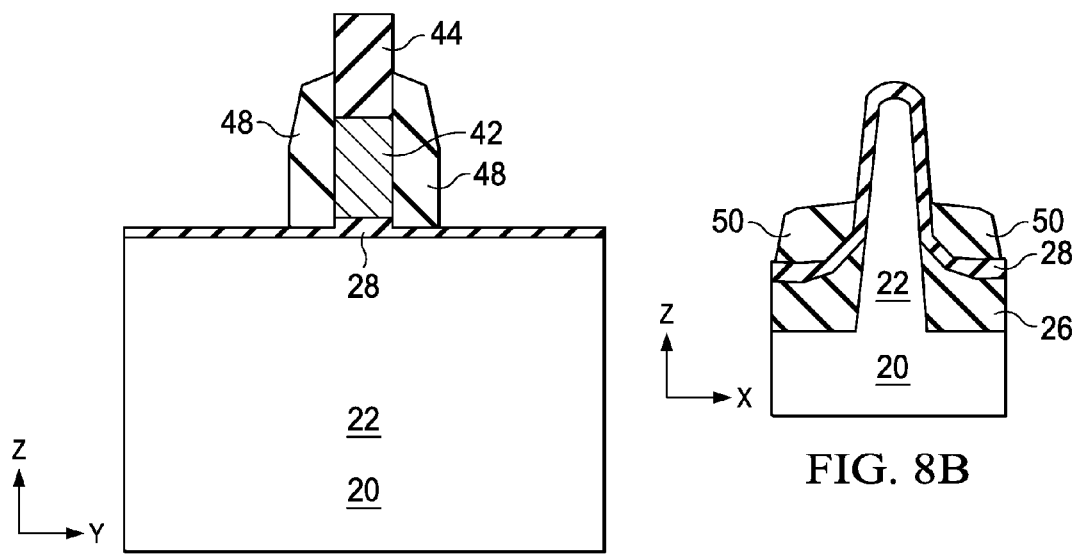
FIG. 8A
FIG. 8B
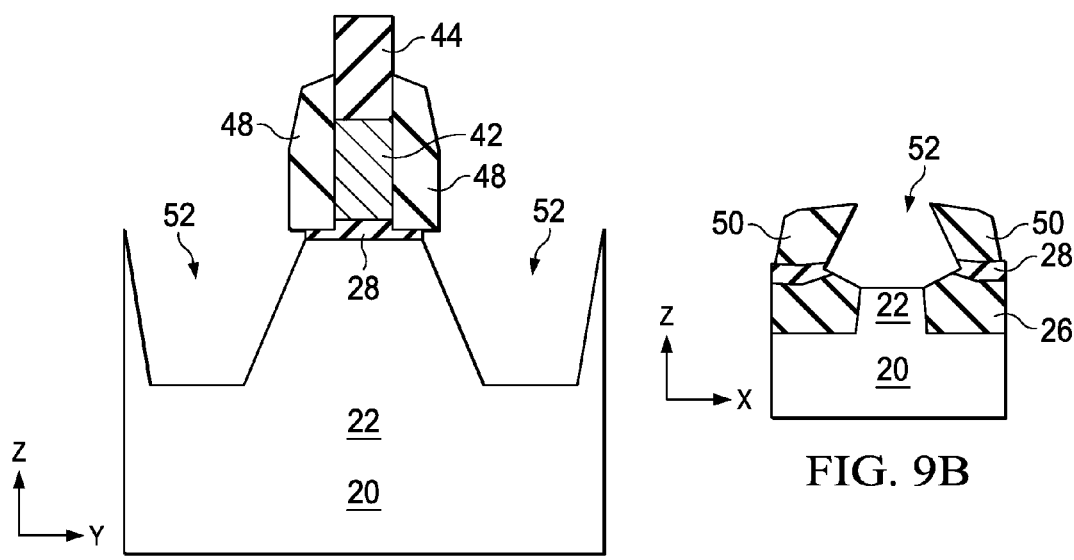
FIG. 9A
FIG. 9B

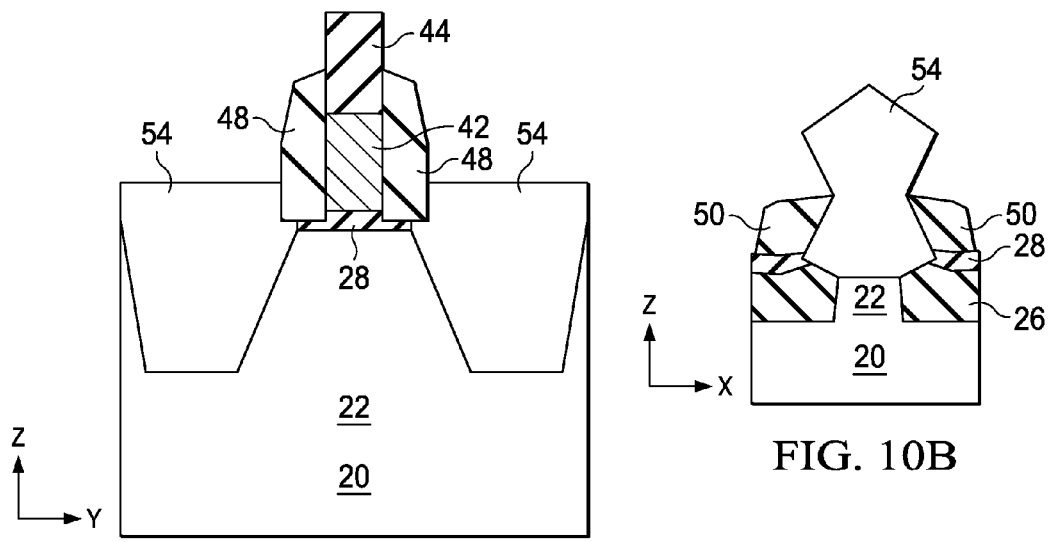
FIG. 10A
FIG. 10B
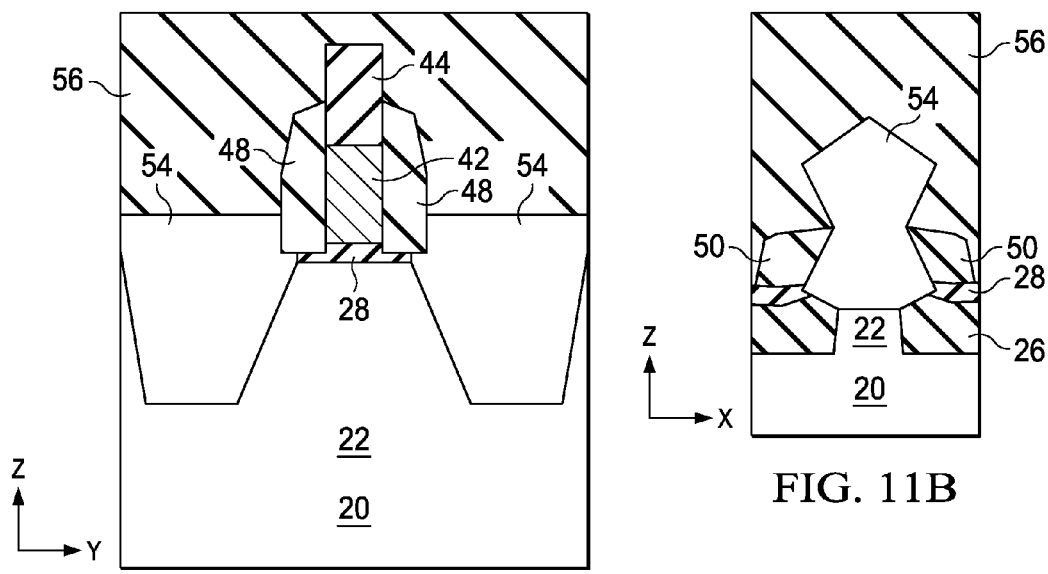
FIG. 11A
FIG. 11B

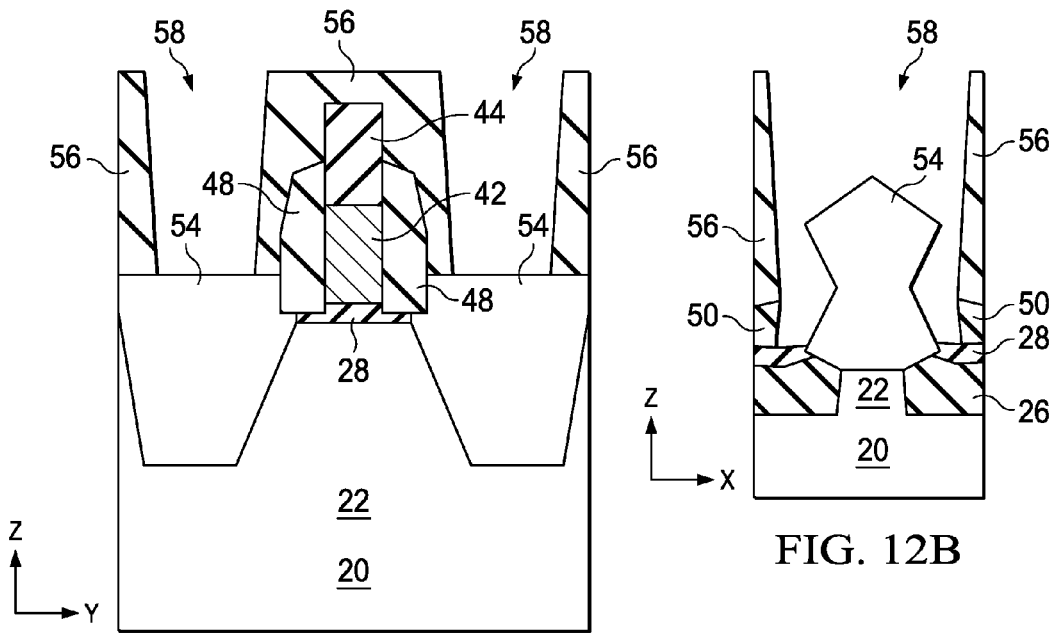
FIG. 12A
FIG. 12B
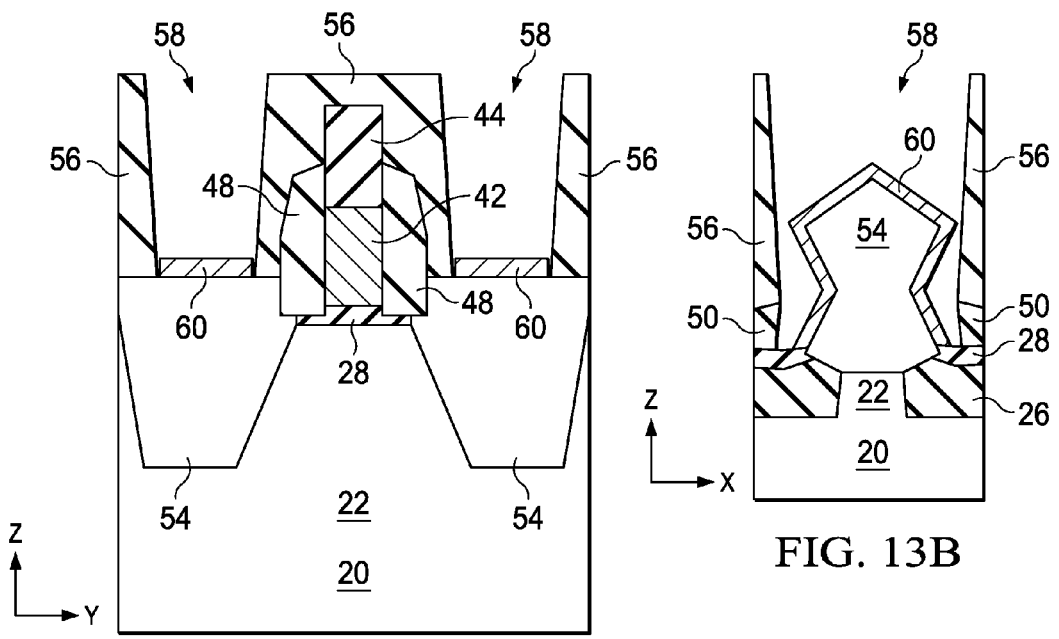
FIG. 13A
FIG. 13B

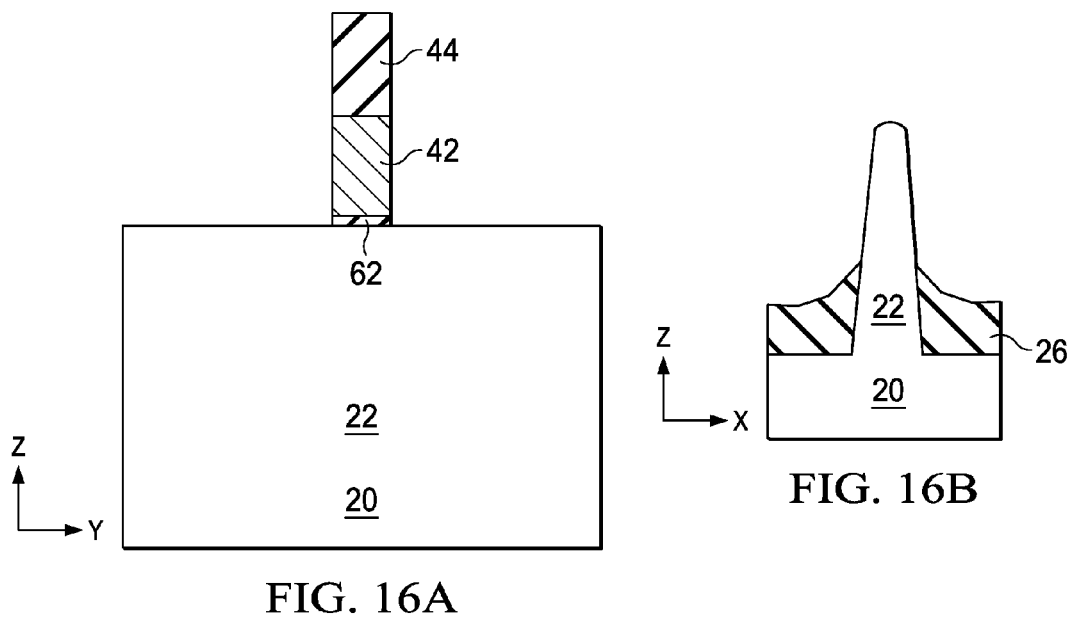
FIG. 16A
FIG. 16B
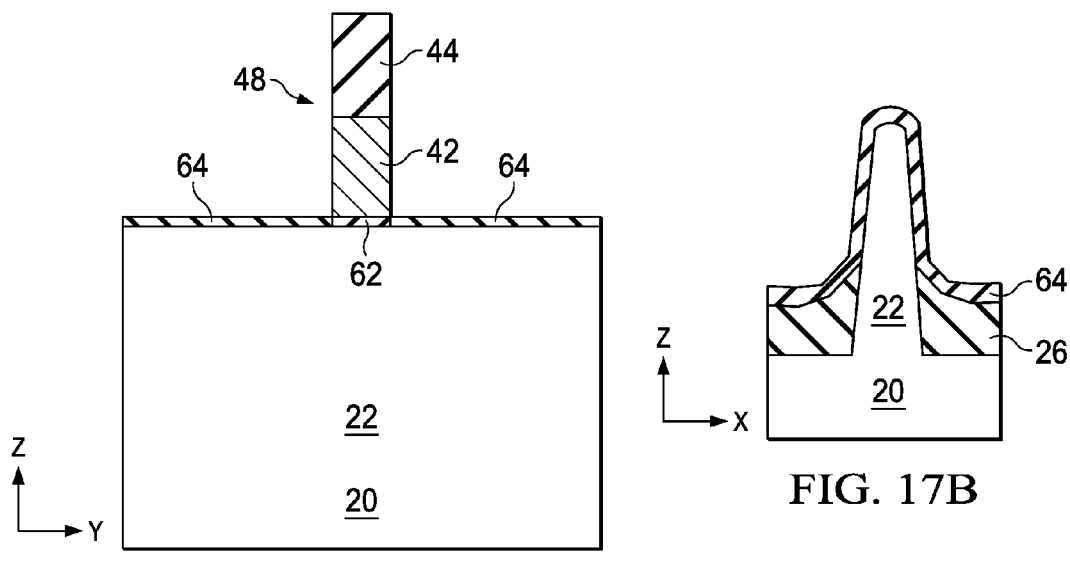
FIG. 17A
FIG. 17B

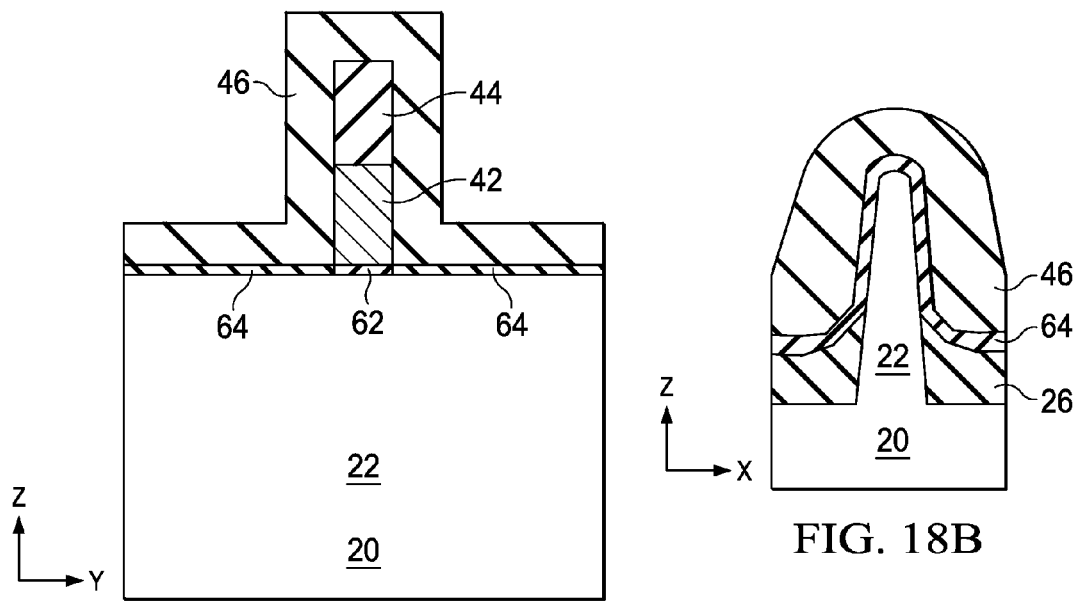
FIG. 18A
FIG. 18B
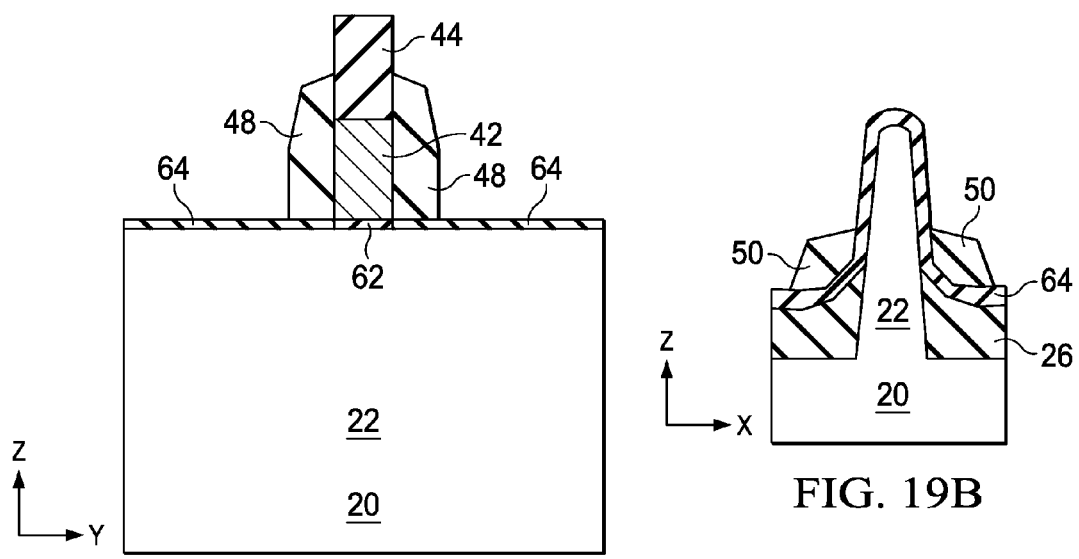
FIG. 19A
FIG. 19B

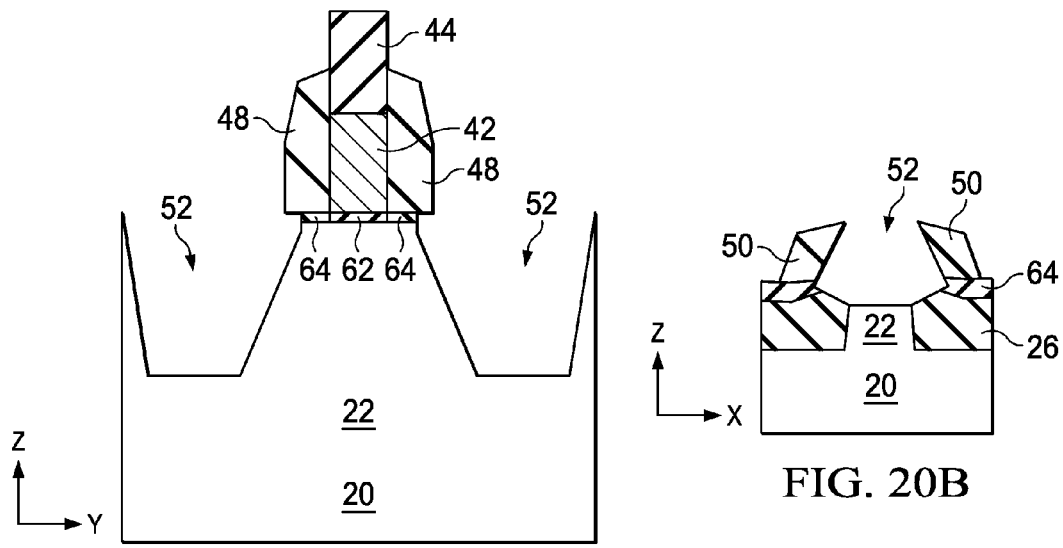
FIG. 20A
FIG. 20B
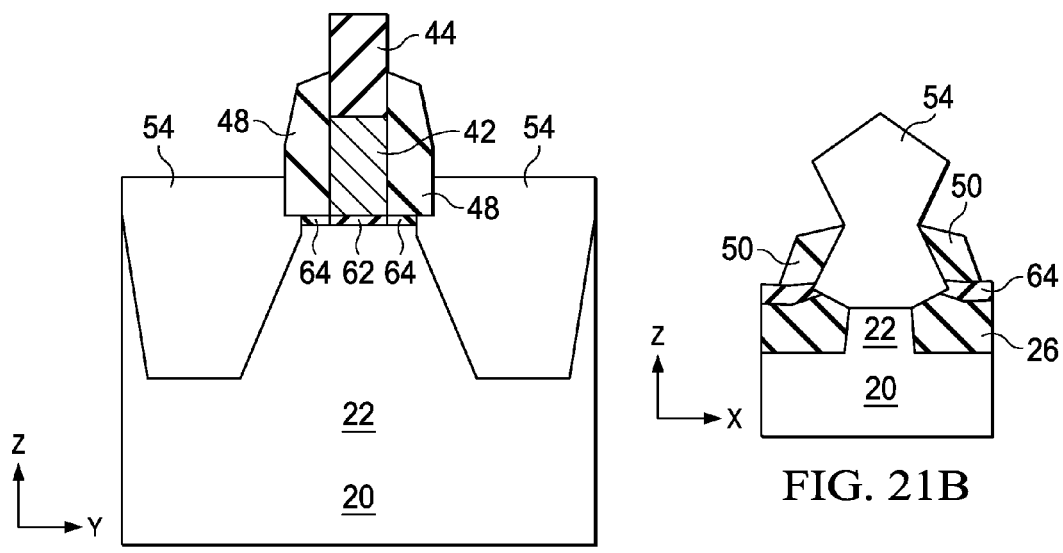
FIG. 21A
FIG. 21B

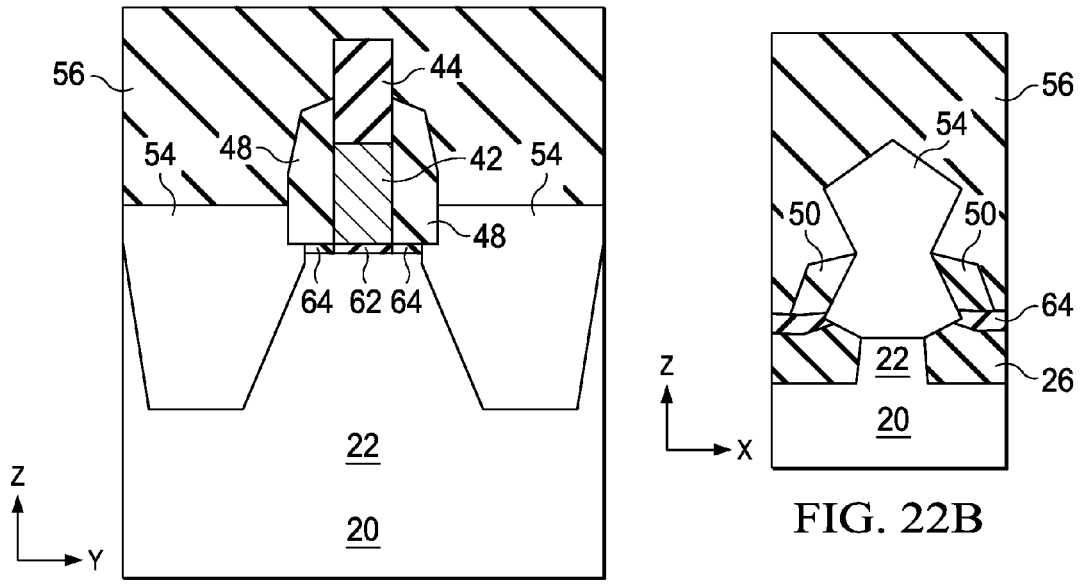
FIG. 22A
FIG. 22B
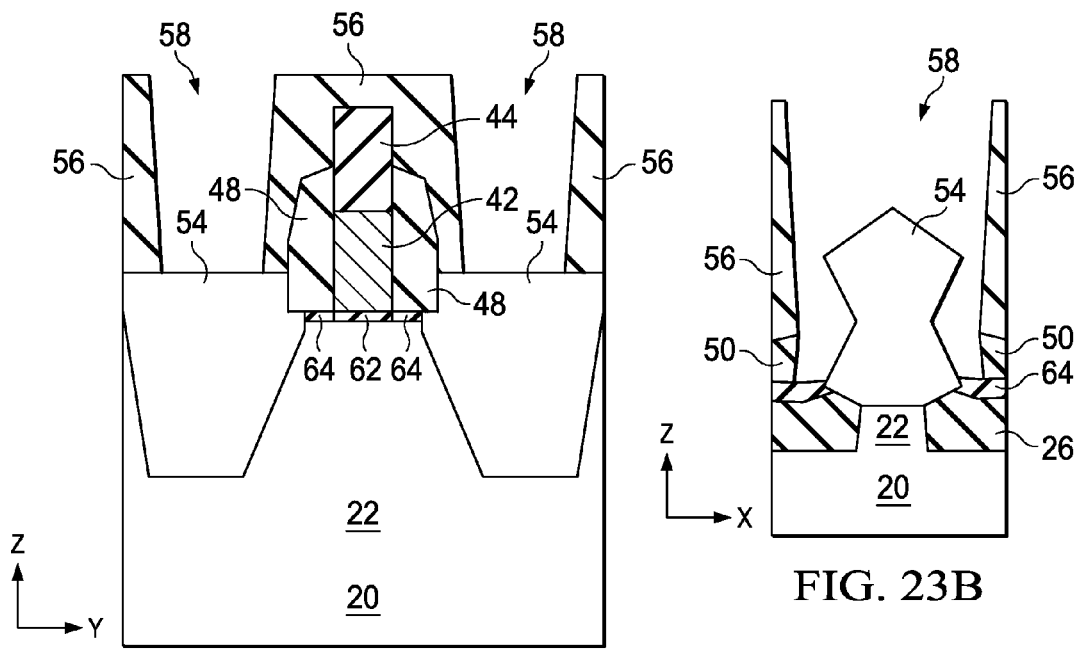
FIG. 23A
FIG. 23B

US 9,496,398 B2

EPITAXIAL SOURCE/DRAIN REGIONS IN FINFETS AND METHODS FOR FORMING THE SAME

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin FETs (finFETs) have been studied to overcome some of these problems.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 4, 5, 6A, 6B, 7A, 7B, 8A, 8B, 9A, 9B, 10A, 10B, 11A, 11B, 12A, 12B, 13A, and 13B are cross-sectional views of intermediate stages in a first manufacturing process for a finFET in accordance with an embodiment; and FIGS. 14, 15, 16A, 16B, 17A, 17B, 18A, 18B, 19A, 19B, 20A, 20B, 21A, 21B, 22A, 22B, 23A, 23B, 24A, and 24B are cross-sectional views of intermediate stages in a second manufacturing process for a finFET in accordance with an embodiment.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

The intermediate stages of forming a Fin FET (finFET) are illustrated. Some variations of the embodiments are discussed. Throughout the various views and illustrative embodiments, like reference numbers are used to designate like elements. Although method embodiments are discussed in a particular order, various other method embodiments may be performed in any logical order and may include fewer or more steps described herein. For example, some embodiments are discussed herein in the context of a gate-first process, whereas other embodiments contemplate a gate-last process.

Figure 1:
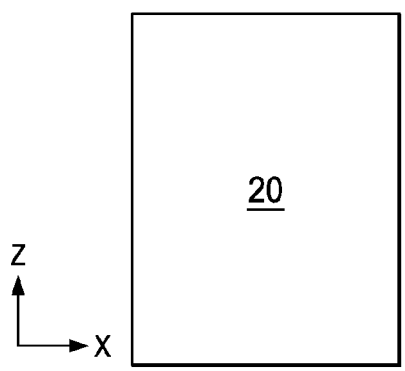
FIGS. 1 through 3 illustrate a method of forming a fin and isolation regions on a substrate according to an embodiment.

FIGS. 1 through 13A and 13B illustrate steps of a first example method of forming a finFET. FIGS. 1 through 4 are cross sections along an X-Z plane, and FIG. 5 is a three dimensional view. FIG. 1 illustrates a substrate 20, which may be, for example, a part of a wafer. Substrate 20 may be a semiconductor substrate, which may further be a silicon substrate, a silicon carbon substrate, a silicon germanium substrate, or a substrate formed of other semiconductor materials. The substrate 20 may be a bulk substrate, a semiconductor-on-insulator (SOI) substrate, or other acceptable substrates. The substrate 20 may be lightly doped with a p-type or an n-type impurity.

Figure 2:
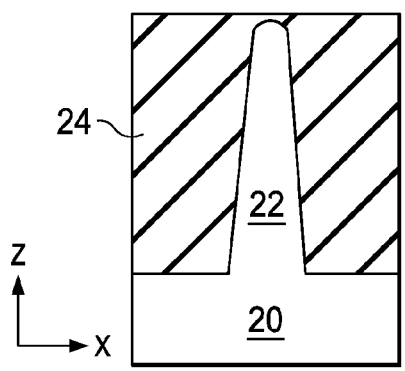
Figure 3:
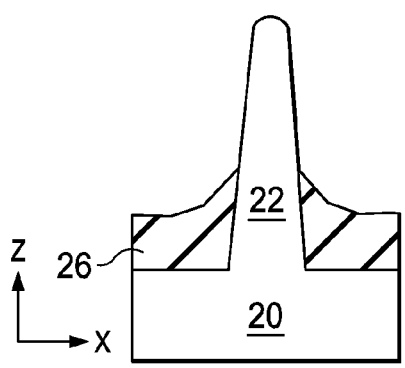

FIGS. 2 and 3 illustrate the formation of a fin 22 and isolation regions 26 between neighboring fins 22. In FIG. 2, the fin 22 is formed in the substrate 20, and a dielectric material 24 is formed between neighboring fins 22. In some embodiments, the fin 22 may be formed in the substrate 20 by etching trenches in the substrate 20. The etching may be any acceptable etch process, such as a reactive ion etch (RIE), neutral beam etch (NBE), the like, or a combination thereof. The dielectric material 24 may be a high density plasma oxide, such as silicon oxide, formed by a high density plasma chemical vapor deposition (CVD) or a flowable CVD (FCVD), such as formed by a CVD-based material deposition in a remote plasma system and post curing to make it convert to oxide. Other dielectric materials formed by any acceptable process may be used. A planarization process, such as a chemical mechanical polish (CMP), may remove any excess dielectric material 24 and form a top surface of the dielectric material 24 and a top surface of the fin 22 that are co-planar.

In FIG. 3, the dielectric material 24 is recessed to form isolation regions 26, which may also be referred to as Shallow Trench Isolation (STI) regions. In FIG. 3, the isolation regions 26 are recessed such that fin 22 protrudes from between neighboring isolation regions 26. The isolation regions 26 may be recessed using an acceptable etching process, such as one that is selective to the material of the isolation regions 26. For example, a chemical oxide removal using a Tokyo Electron CERTAS or an Applied Materials SICONI tool or dilute hydrofluoric (DHF) acid may be used.

A person having ordinary skill in the art will readily understand that the process described with respect to FIGS. 2 and 3 is just one example of how a fin 22 may be formed. In other embodiments, a dielectric layer can be formed over a top surface of the substrate 20; trenches can be etched through the dielectric layer; homo-epitaxial structures can be epitaxially grown in the trenches; and the dielectric layer can be recessed such that the homo-epitaxial structures protrude from the dielectric layer to form fins.

In still other embodiments, heteroepitaxial structures can be used for the fin. For example, the fin 22 in FIG. 2 can be recessed, and a material different from the fin 22 may be epitaxially grown in its place. In an even further embodiment, a dielectric layer can be formed over a top surface of the substrate 20; trenches can be etched through the dielectric layer; heteroepitaxial structures can be epitaxially grown in the trenches using a material different from the substrate 20; and the dielectric layer can be recessed such that the heteroepitaxial structures protrude from the dielectric layer to form fins.

In some embodiments where homo-epitaxial or heteroepitaxial structures are epitaxially grown, the grown materials may be in situ doped during growth, which may obviate some implantations although in situ and implantation doping may be used together. Still further, it may be advantageous to epitaxially grow a material in an NFET region different from the material in a PFET region. In various embodiments, the fin 22 may comprise or consist essentially of silicon, silicon germanium, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. A person of ordinary skill in the art will readily understand other methods of forming the fin, which are contemplated within the scope of some embodiments.

Although not depicted, a P well and/or an N well may be formed in various regions of the fins and/or substrate 20. For example, during the processing discussed with respect to FIGS. 2 and 3, a photoresist can be formed over the fin 22 and the dielectric material 24 or the isolation regions 26. The photoresist can be patterned to expose a region of the substrate 20, such as an NFET region, by using a spin-on technique and acceptable photolithography techniques. Once patterned, a p-type impurity implant may be performed in the NFET region. The p-type impurities may be boron, $BF_2$, or the like implanted in the NFET region to a concentration of equal to or less than $7 \times 10^{18}$ cm$^{-3}$, such as between about $10^{15}$ cm$^{-3}$ and about $7 \times 10^{18}$ cm$^{-3}$. After the implant, the photoresist may be removed, such as by an acceptable ashing process. Another photoresist may be patterned to expose another region of the substrate 20, such as a PFET region, using similar techniques, and an n-type impurity implant may be performed in the PFET region. The n-type impurities may be phosphorus, arsenic, or the like implanted in the PFET region to a concentration of equal to or less than $7 \times 10^{18}$ cm$^{-3}$, such as between about $10^{15}$ cm$^{-3}$ and about $7 \times 10^{18}$ cm$^{-3}$. After the implant, the photoresist may be removed, such as by an acceptable ashing process. After the implants, an anneal may be performed to activate the p-type and n-type impurities that were implanted. The implantations may form a p-well in the NFET region and an n-well in the PFET region.

Figure 4:
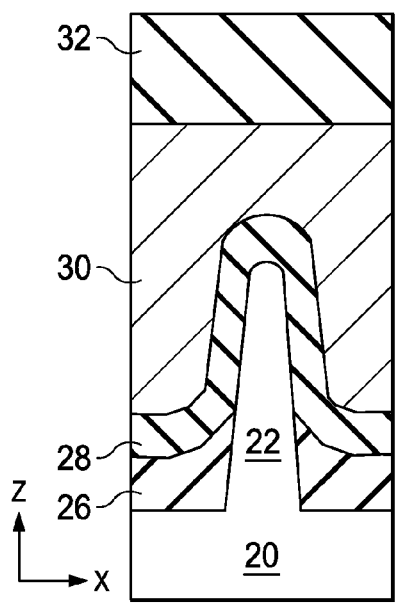
Figure 5:
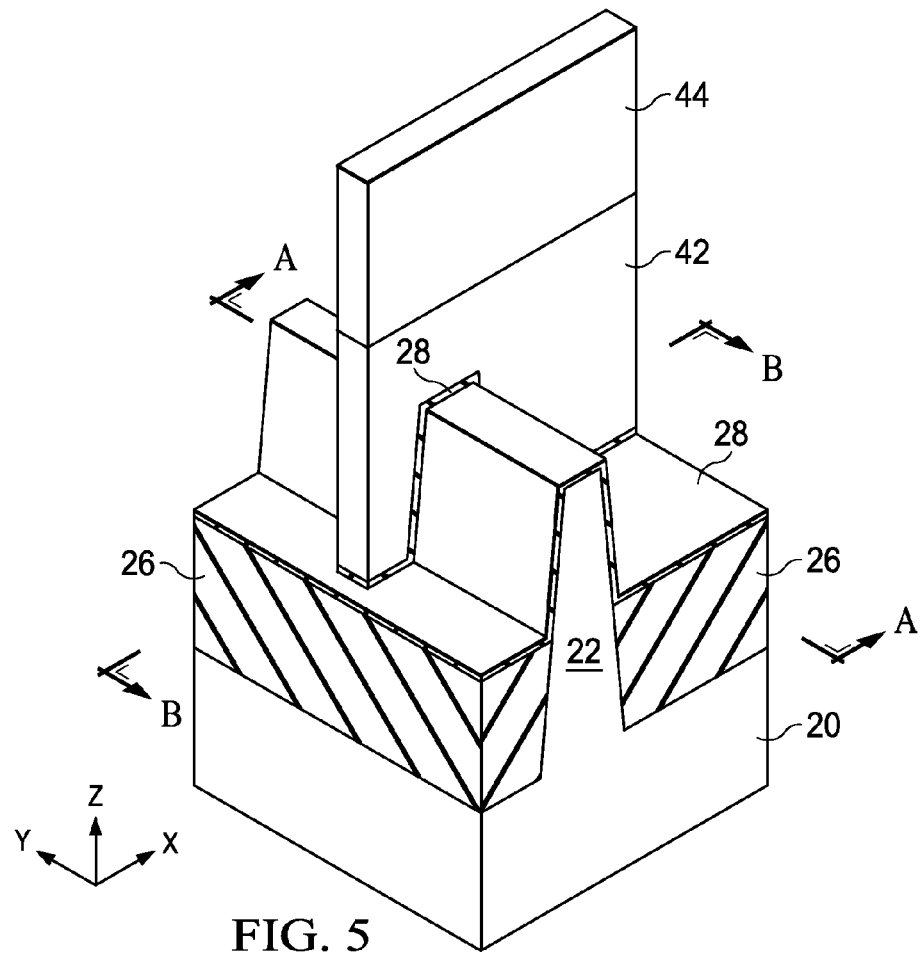

FIG. 4 illustrates a gate dielectric/dummy layer 28 formed over the fin 22 and the isolation regions 26, a gate electrode layer 30 over the gate dielectric/dummy layer 28, and a mask layer 32 over the gate electrode layer 30. In an embodiment, gate dielectric/dummy layer 28 comprises silicon oxide, silicon nitride, silicon carbon nitride, silicon oxynitride, silicon carbide, silicon oxycarbide, or the like. The formation methods of gate dielectric/dummy layer 28 may include Atomic Layer Deposition (ALD), CVD, Plasma Enhanced Chemical Vapor Deposition (PECVD), a furnace deposition process, thermal oxidation, any material that may be removable with a wet etch with selectivity, or the like. The gate electrode layer 30 may comprise polysilicon (doped or undoped), a metal-containing material such as TiN, TaN, TaC, Co, Ru, Al, W, combinations thereof, or multi-layers thereof. The gate electrode layer 30 may be deposited using CVD, ALD, physical vapor deposition (PVD), the like, or a combination thereof. The mask layer 32 may comprise silicon nitride, silicon oxide, silicon oxynitride, the like, or a combination thereof, and may be deposited using CVD, ALD, PVD, the like, or a combination thereof.

FIG. 5 illustrates an example of an intermediate finFET in a three-dimensional view. In FIG. 5, the mask layer 32 and the gate electrode layer 30 are patterned to form a mask 44 and a gate electrode 42, respectively. The gate dielectric/dummy layer 28 that is not under the gate electrode 42 may be thinned by an etching during the patterning of the mask 44 and gate electrode 42. As illustrated, a step or change in thickness may be formed in the gate dielectric/dummy layer 28 proximate the transition from a region underlying the gate electrode 42 to a region that does not underlie the gate electrode 42. The patterning may use an acceptable photolithography and etch process(es), such as an RIE, CCP, ICP, the like, or a combination thereof. The etch may be selective to a desired material and may be anisotropic.

FIG. 5 further illustrates various cross sections used for reference in other figures. Cross section A-A is in a Y-Z plane and is illustrated as a reference for figures ending in "A". Cross section B-B is in an X-Z plane and is illustrated as a reference for figures ending in "B". Further, cross section B-B may be a reference plane for the cross sections in FIGS. 1 through 4, although any X-Z plane may be illustrated in those figures.

FIGS. 6A and 6B illustrate respective cross sections of the intermediate finFET of FIG. 5. FIG. 6A illustrates the substrate 20 including the fin 22, the gate dielectric/dummy layer 28, the gate electrode 42 over the gate dielectric/dummy layer 28, and the mask 44 over the gate electrode 42. A region of the gate dielectric/dummy layer 28 over a channel region of the fin 22 may act as a gate dielectric for the gate electrode 42, and a region of the gate dielectric/dummy layer 28 over a source/drain region of the fin 22 may act as a dummy layer. FIG. 6B illustrates the substrate 20 including the fin 22, the isolation regions 26 adjacent the fin 22, and the gate dielectric/dummy layer 28 over a source/drain region, which may act as a dummy layer.

In FIGS. 7A and 7B, a spacer layer 46 is conformally deposited over the intermediate finFET structure in FIGS. 5, 6A, and 6B. Specifically, the spacer layer 46 is illustrated as being conformally over a top surface of the fin 22 and along sidewalls of and over a top surface of the gate structure including the gate electrode 42 and the mask 44 in FIG. 7A. Further, the spacer layer 46 is illustrated as being conformally along sidewalls of the fin 22 and along top surfaces of the isolation regions 26 in FIG. 7B. The spacer layer 46 may be silicon nitride (SiN), silicon carbon-nitride (SiCN), silicon carbon-oxynitride (SiCON), the like, or a combination thereof, formed by CVD, ALD, the like, or a combination thereof.

In FIGS. 8A and 8B, the spacer layer 46 is anisotropically etched to form spacers 48 on sidewalls of the gate structure, e.g., at least adjoining the gate electrode 42. The spacer 48 may also remain on sidewalls of the gate dielectric region of the gate dielectric/dummy layer 28 if the gate dielectric/dummy layer 28 was thinned in the dummy region during the patterning of the gate electrode 42 and mask 44. Also as a result of this etch, residual portions 50 of the spacer layer 46 remain over the isolation regions 26 and the dummy region of the gate dielectric/dummy layer 28 proximate sidewalls of the fin 22. The etch may be an RIE, CCP, ICP, transformer coupled plasma (TCP), a high density plasma (HDP) etch, electron cyclotron resonance (ECR) etch, the like, or a combination thereof. The etch may be selective to the spacer layer 46 such that the gate dielectric/dummy layer 28 is substantially not etched.

In FIGS. 9A and 9B, dummy regions of the gate dielectric/dummy layer 28, portions of the isolation regions 26, and portions of the fin 22 are etched, for example, using an isotropic etch. The etch may be a wet etch and may use hydrofluoric acid, SICONI, tris-borate-ethylene diamine tetraacetic acid (TBE), buffered oxide etch (BOE), or the like as an etchant. With an isotropic etch, the gate dielectric/dummy layer 28 may be etched to undercut the spacers 48. In embodiments where the materials of the gate dielectric/dummy layer 28, the isolation regions 26, and fin 22 have the same selectivity, the etch may etch the gate dielectric/dummy layer 28, the isolation regions 26, and the fin 22 during a same process step. In other embodiments, multiple etch process steps comprising different etchants may be used. In still further embodiments, the isolation regions 26 are not etched. The etch may be selective to the gate dielectric/dummy layer 28 and the fin 22 such that the spacers 48 and residual portions 50 are not substantially etched. The etch results in a recess 52 to an upper surface(s) of a remaining portion of the fin 22. The depth of the recess 52 may be between about 5 nm and about 150 nm from the original top surface of the fin 22 to an upper surface of a remaining portion of the fin 22. The recess 52, as illustrated, is defined in part by the residual portions 50. The recess 52 has a wide bottom portion and is constrained in an upper region of the recess 52 by the residual portions 50.

In FIGS. 10A and 10B, raised epitaxial source/drain regions 54 are epitaxially grown. The raised epitaxial source/drain regions 54 are grown from the upper surfaces of the remaining portions of the fin 22 in the recesses 52 and above the recesses 52. The raised epitaxial source/drain regions 54 have a constrained mid-region, as illustrated, due to the presence of the residual portions 50, for example. As shown in FIG. 10B, the raised epitaxial source/drain region 54 has a wider lower-region, a thinner mid-region, and a wider upper-region. The raised epitaxial source/drain regions 54 may comprise or consist essentially of silicon, silicon germanium, germanium, silicon carbide, indium phosphide (InP), gallium arsenide (GaAs), the like, or a combination thereof, and may be epitaxially grown using metal-organic CVD (MOCVD), molecular beam epitaxy (MBE), liquid phase epitaxy (LPE), vapor phase epitaxy (VPE), selective epitaxial growth (SEG), the like, or a combination thereof. The raised epitaxial source/drain regions 54 may further be doped to a concentration of greater than or equal to $5 \times 10^{19}$ cm$^{-3}$ by in situ doping during growth and/or subsequent implantation. The dopants may include, for example, boron, indium, or the like for a p-type transistor, and may include, for example, phosphorus, arsenic, or the like for an n-type transistor.

In FIGS. 11A and 11B, a dielectric layer 56, such as an inter-layer dielectric (ILD) layer, is formed over the structure illustrated in FIGS. 10A and 10B, such as over the raised epitaxial source/drain regions 54, the spacers 48, and the mask 44. In an example, the dielectric layer 56 includes an etch stop layer over the substrate 20 and an ILD over the etch stop layer. In such example, the etch stop layer may be formed of SiN, SiCN, SiCO, CN, a combination thereof, or the like, deposited by CVD, PECVD techniques, the like, or a combination thereof. Further in such example, the ILD layer may be formed of a low-K dielectric material, such as silicon oxide, tetraethyl orthosilicate (TEOS), phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. The etch stop layer is formed of a dielectric material having a different etch selectivity from adjacent layers, e.g., the underlying substrate and the overlying ILD layer. The etch stop layer and the ILD layer may each comprise a plurality of dielectric layers and/or materials.

In FIGS. 12A and 12B, contact openings 58 are etched through the dielectric layer 56 to the raised epitaxial source/drain regions 54. The etching may comprise one or more of a dry etch and a wet etch, and one or more of an anisotropic etch and an isotropic etch. For example, a DHF acid, TBE, BOE, phosphoric acid ($H_3PO_4$), or the like may be used. The etching may remove at least some of the residual portions 50 proximate the raised epitaxial source/drain regions 54, such as proximate the wider lower-region as illustrated, and hence, more surface area of the raised epitaxial source/drain regions 54 may be exposed.

In FIGS. 13A and 13B, semiconductor-metal compound regions 60 are formed on exposed surfaces of the raised epitaxial source/drain regions 54. Semiconductor-metal compound regions 60, such as silicide regions, may be formed by depositing a thin layer of a metal, such as titanium, cobalt, nickel, tungsten, or the like, by an acceptable process, such as atomic layer deposition (ALD), CVD, PVD, or the like. An anneal is then performed to react the metal with the semiconductor material of the raised epitaxial source/drain regions 54. After the reaction, a layer of semiconductor-metal compound may be formed between semiconductor and the metal. The un-reacted metal may be selectively removed through the use of an etchant that attacks the metal but does not attack the semiconductor-metal compound. As a result of the reaction, semiconductor-metal compound regions 60 extend into the raised epitaxial source/drain regions 54. Example semiconductor-metal compound regions 60 materials include NiSi, NiSiGe, TiSi, TiSiGe, or the like. In other embodiments, the semiconductor-metal compound regions 60 may be replaced with a tunneling contact that includes a metal-insulator-semiconductor structure.

Following the formation of the semiconductor-metal compound regions 60, the contact openings 58 may be filled with a conductive material, which may include a barrier layer. Further dielectric layers, such as inter-metal dielectric (IMD) layers, which may include metallization patterns, and any corresponding etch stop layers, may be formed over the dielectric layer 56. A person of ordinary skill in the art will understand additional processing that structures in the figures may undergo, and hence, explicit discussion is omitted herein for brevity.

Figure 14:
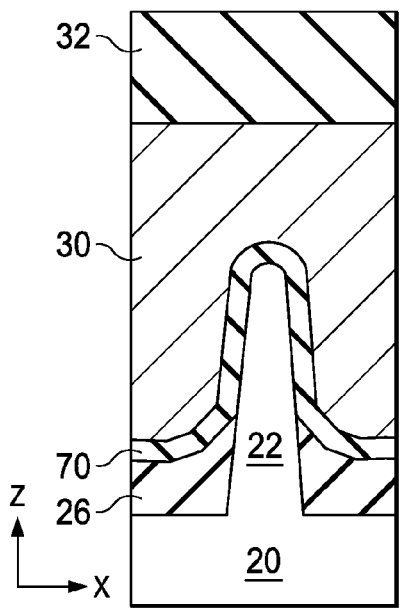

FIGS. 14 through 24A and 24B illustrate steps of a second example method of forming a finFET. FIGS. 14 through 24A and 24B are illustrated with similar axes and corresponding cross-sections as discussed above. A substrate 20 having a fin 22 with isolation regions 26 is formed as discussed above with respect to FIGS. 1 through 3. FIG. 14 illustrates a gate dielectric layer 70 formed over the fins 22 and the isolation regions 26, a gate electrode layer 30 over the gate dielectric layer 70, and a mask layer 32 over the gate electrode layer 30. In an embodiment, gate dielectric layer 70 comprises silicon oxide, silicon nitride, a high-k dielectric material, or the like. In embodiments with a high-k dielectric material, gate dielectric layer 70 may have a k value greater than about 7.0, and may include a metal oxide or a silicate of Hf, Al, Zr, La, Mg, Ba, Ti, Pb, and combinations thereof. The formation methods of gate dielectric layer 70 may include thermal oxidation, Molecular-Beam Deposition (MBD), ALD, CVD, PECVD, and the like. The gate electrode layer 30 and mask layer 32 may comprise materials as previously discussed and may be formed as previously discussed.

Figure 15:
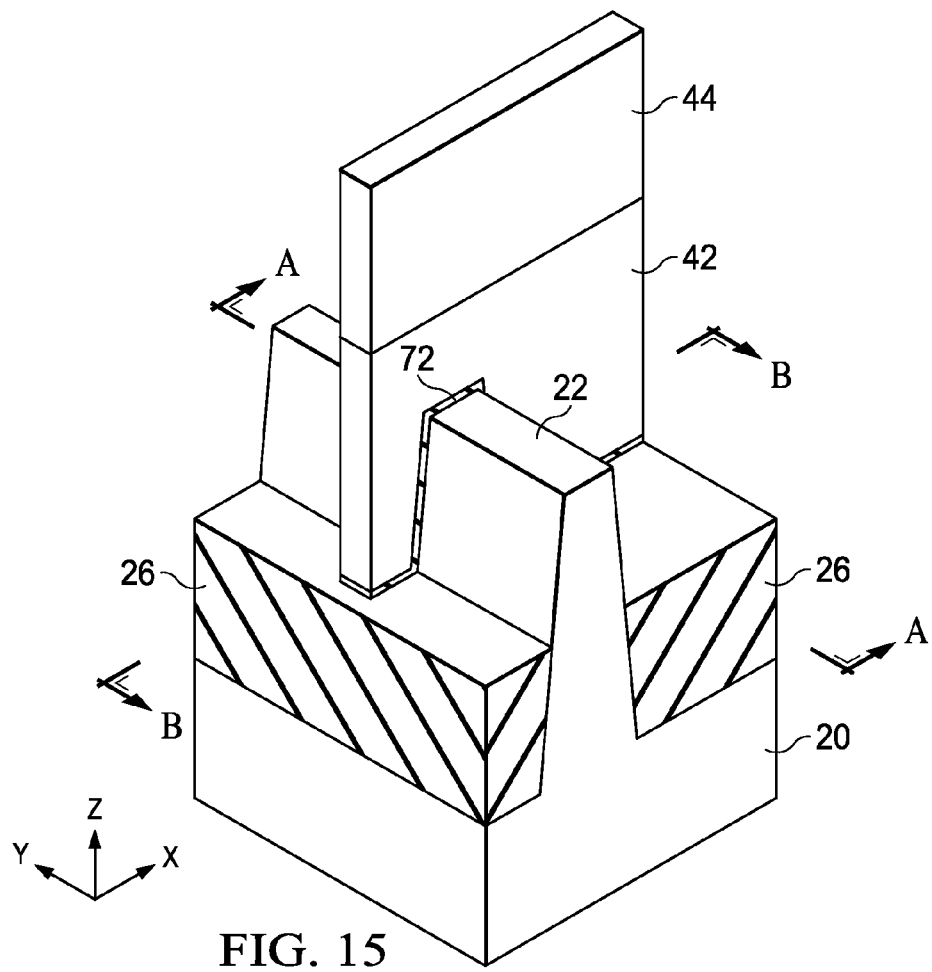

FIG. 15 illustrates an example of an intermediate finFET in a three-dimensional view. In FIG. 15, the mask layer 32, the gate electrode layer 30, and the gate dielectric layer 70 are patterned to form a mask 44, a gate electrode 42, and a gate dielectric 72, respectively. The portions of the fin 22 that do not underlie the gate structure and that protrude from the isolation regions 26 are exposed. The patterning may use an acceptable photolithography and etch process(es), such as an RIE, CCP, ICP, the like, or a combination thereof. The etch may be selective to a desired material and may be anisotropic. FIG. 15 further illustrates various cross sections used for reference in other figures. Cross section A-A is in a Y-Z plane and is illustrated as a reference for figures ending in "A". Cross section B-B is in an X-Z plane and is illustrated as a reference for figures ending in "B".

FIGS. 16A and 16B illustrate respective cross sections of the intermediate finFET of FIG. 15. FIG. 16A illustrates the substrate 20 including the fin 22, the gate dielectric 72, the gate electrode 42 over the gate dielectric 72, and the mask 44 over the gate electrode 42. FIG. 16B illustrates the substrate 20 including the fin 22 and the isolation regions 26 adjacent the fin 22.

In FIGS. 17A and 17B, a dummy layer 64 is formed on exposed surfaces of the fin 22 and the isolation regions 26. In an embodiment, the dummy layer 64 comprises a silicon oxide formed by a furnace deposition or thermal oxidation process. In other embodiments, the dummy layer 64 may comprise other materials, such as silicon nitride, silicon carbon nitride, silicon oxynitride, silicon carbide, silicon oxycarbide, or the like, formed by other acceptable processes, such as ALD, CVD, PECVD, or the like.

In FIGS. 18A and 18B, a spacer layer 46 is conformally deposited over the gate structure and dummy layer 64 of FIGS. 17A and 17B. The spacer layer 46 may comprise the materials and may be formed using the processes discussed above with respect to FIGS. 7A and 7B. In FIGS. 19A and 19B, the spacer layer 46 is anisotropically etched to form spacers 48 on sidewalls of the gate structure, e.g., at least adjoining the gate electrode 42. Residual portions 50 remain on the dummy layer 64 in FIG. 19B. The etching and formation of the spacers 48 and residual portions 50 may be formed as discussed above with respect to FIGS. 8A and 8B.

In FIGS. 20A and 20B, the dummy layer 64, portions of the isolation regions 26, and portions of the fin 22 are etched, for example, using an isotropic etch. The etch may be a wet etch and may use hydrofluoric acid, SICONI, TBE, BOE, or the like as an etchant. With an isotropic etch, the dummy layer 64 may be etched to undercut the spacers 48. In embodiments where the materials of the dummy layer 64, the isolation regions 26, and the fin 22 have the same selectivity, the etch may etch the dummy layer 64, the isolation regions 26, and the fin 22 during a same process step. In other embodiments, multiple etch process steps comprising different etchants may be used. In still further embodiments, the isolation regions 26 are not etched. The etch may be selective to the dummy layer 64 and the fin 22 such that the spacers 48 and residual portions 50 are not substantially etched. The etch results in a recess 52 to an upper surface(s) of a remaining portion of the fin 22. The depth of the recess 52 may be between about 5 nm and about 150 nm from the original top surface of the fin 22 to an upper surface of a remaining portion of the fin 22. The recess 52, as illustrated, is defined in part by the residual portions 50. The recess 52 has a wide bottom portion and is constrained in an upper region of the recess 52 by the residual portions 50.

In FIGS. 21A and 21B, raised epitaxial source/drain regions 54 are epitaxially grown. The raised epitaxial source/drain regions 54 are grown from the upper surfaces of the remaining portions of fin 22 in the recesses 52 and above the recesses 52. The raised epitaxial source/drain regions 54 have a constrained mid-region as illustrated due to the presence of the residual portions 50, for example. As shown in FIG. 21B, the raised epitaxial source/drain region 54 has a wider lower-region, a thinner mid-region, and a wider upper-region. The raised epitaxial source/drain regions 54 may comprise the materials and may be formed in the manner discussed with respect to FIGS. 10A and 10B.

Figures 24A, 24B:
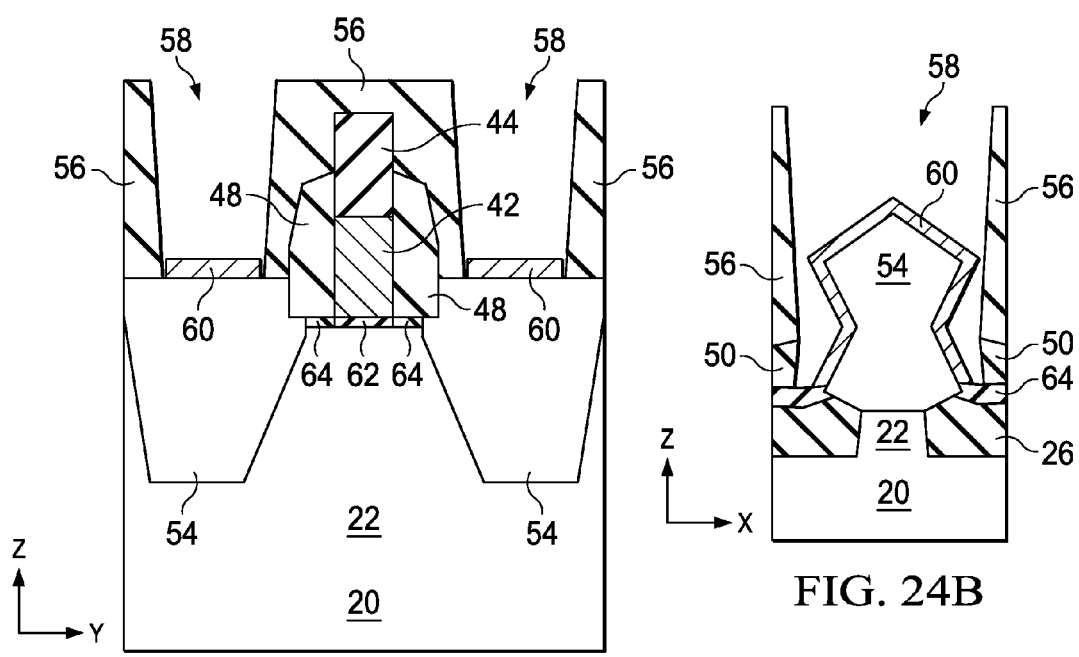

In FIGS. 22A and 22B, a dielectric layer 56, such as an ILD layer, is formed over the structure illustrated in FIGS. 21A and 21B, such as over the raised epitaxial source/drain regions 54, the spacers 48, and the mask 44. The dielectric layer 56 may be formed in the manner as discussed with respect to FIGS. 11A and 11B. In FIGS. 23A and 23B, contact openings 58 are etched through the dielectric layer 56 to the raised epitaxial source/drain regions 54 in the manner discussed with respect to FIGS. 12A and 12B. In FIGS. 24A and 24B, semiconductor-metal compound regions 60 are formed on exposed surfaces of the raised epitaxial source/drain regions 54 in the manner discussed with respect to FIGS. 13A and 13B.

Following the formation of the semiconductor-metal compound regions 60, the contact openings 58 may be filled with a conductive material, which may include a barrier layer. Further dielectric layers, such as inter-metal dielectric (IMD) layers, which may include metallization patterns, and any corresponding etch stop layers, may be formed over the dielectric layer 56. A person of ordinary skill in the art will understand additional processing that structures in the figures may undergo, and hence, explicit discussion is omitted herein for brevity.

As illustrated in the embodiments, the semiconductor-metal compound regions 60 are formed on exposed surfaces of the raised epitaxial source/drain regions 54. As a result of the recess 52 formation and the presence of residual portions 50 during the raised epitaxial source/drain regions 54 growth, the surfaces of raised epitaxial source/drain regions 54 on which the semiconductor-metal compound regions 60 are formed are not vertical but comprise inward and outward sloping sidewalls, as illustrated in the figures. By having the sidewalls be in this configuration or similar, sidewalls of the raised epitaxial source/drain regions 54, and hence, the semiconductor-metal compound regions 60, can have a greater surface area, such as greater than 80%, which may result in a decreased contact resistance of a contact formed to the semiconductor-metal compound regions 60.

An embodiment is a structure comprising a substrate comprising a fin and an isolation region adjoining the fin, and a raised epitaxial source/drain region on the fin. A first lateral distance is between opposing exterior surfaces of the raised epitaxial source/drain region at an upper portion of the raised epitaxial source/drain region. A second lateral distance is between opposing exterior surfaces of the raised epitaxial source/drain region at a mid portion of the raised epitaxial source/drain region. A third lateral distance is between opposing exterior surfaces of the raised epitaxial source/drain region at a lower portion of the raised epitaxial source/drain region. The first lateral distance is greater than the second lateral distance, and the second lateral distance is less than the third lateral distance.

Another embodiment is a structure comprising a semiconductor fin on a substrate, a gate structure over a channel region in the semiconductor fin, and a raised epitaxial source/drain region on the semiconductor fin and proximate the gate structure. An isolation region is on the substrate and proximate the semiconductor fin. The raised epitaxial source/drain region has a first width at a position proximate the isolation region, a second width at a position distal from the isolation region, and a third width at a position between the position proximate the isolation region and the position distal from the isolation region. The first width is greater than the third width, and the second width is greater than the third width.

A further embodiment is a method comprising forming a fin on a substrate, an isolation region being proximate the fin; forming a dummy layer over the fin and the isolation region; forming a masking portion at least over the dummy layer proximate a junction of the fin and the isolation region; removing a portion of the dummy layer over the fin and below the masking portion to form a recess in the dummy layer below the masking portion, the recess having a first width in a lower portion of the recess that is greater than a second width in an upper portion of the recess; and epitaxially growing a raised source/drain region on the fin and in the recess and above the recess.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a fin on a substrate, an isolation region being proximate the fin;
   forming a dummy layer over the fin and the isolation region;
   forming a masking portion at least over the dummy layer proximate a junction of the fin and the isolation region;
   after forming the masking portion, removing a portion of the dummy layer over the fin and below the masking portion to form a recess in the dummy layer below the masking portion, the recess having a first width in a lower portion of the recess that is greater than a second width in an upper portion of the recess; and
   epitaxially growing a raised source/drain region on the fin and in the recess and above the recess.

2. The method of claim 1 further comprising forming a semiconductor-metal compound on the raised source/drain region.

3. The method of claim 1 further comprising forming a gate structure on the fin, a gate dielectric of the gate structure being formed simultaneously with the dummy layer.

4. The method of claim 1 further comprising forming a gate structure on the fin, a gate dielectric of the gate structure being formed distinctly from the dummy layer.

5. The method of claim 1 further comprising:
   forming a gate structure on the fin; and
   forming a spacer along a sidewall of the gate structure, the spacer being formed simultaneously with the masking portion.

6. The method of claim 1 further comprising:
   forming a gate structure on the fin; and
   forming a spacer along a sidewall of the gate structure, the spacer being over a surface of the dummy layer, the dummy layer being distinct from a gate dielectric layer of the gate structure.

7. The method of claim 1 further comprising:
   forming a gate structure on the fin; and
   forming a spacer along a sidewall of the gate structure, the spacer being along a sidewall surface of the dummy layer and over an upper surface of the dummy layer, the dummy layer being a gate dielectric layer of the gate structure.

8. The method of claim 1 further comprising:
   forming a dielectric layer over the raised source/drain region; and
   etching an opening to the raised source/drain region, the etching removing at least a portion of the masking portion.

9. The method of claim 1, wherein the raised source/drain region has a first width at a position proximate the isolation region, a second width at a position distal from the isolation region, and a third width at a position between the position proximate the isolation region and the position distal from the isolation region, the first width being greater than the third width, the second width being greater than the third width.

10. A method comprising:
    forming a fin protruding from between isolation regions;
    forming masking portions along opposing sidewalls of the fin and over the isolation regions;
    forming a first opening through the masking portions by removing at least a portion of the fin, the first opening having a first lateral dimension defined by the masking portions at a first location and a second lateral dimension at a second location below the first location, the second lateral dimension being greater than the first lateral dimension; and
    epitaxially growing a source/drain region in the first opening and extending above the first opening, the source/drain region having the first lateral dimension at the first location, the second lateral dimension at the second location, and a third lateral dimension at a third location above the first location, the third lateral dimension being greater than the first lateral dimension.

11. The method of claim 10 further comprising:
    forming a dielectric layer over the source/drain region;
    forming a second opening through the dielectric layer to the source/drain region; and
    forming, through the second opening, a semiconductor-metal compound on the source/drain region.

12. The method of claim 10 further comprising:
    forming a dielectric layer over the source/drain region; and
    forming a second opening through the dielectric layer to the source/drain region, the forming the second opening further removing respective portions of the masking portions.

13. The method of claim 10 further comprising:
    forming a dummy layer over the isolation regions and on the opposing sidewalls of the fin, the masking portions being formed on the dummy layer, the forming the first opening further removing a portion of the dummy layer.

14. The method of claim 10 further comprising:
    forming a gate structure on the fin; and
    forming a spacer along a sidewall of the gate structure, the spacer being formed simultaneously with the masking portions.

15. A method comprising:
    forming a fin protruding above and from between isolation regions on a substrate;
    forming masking portions along opposing sidewalls of the fin, the masking portions proximate junctions of the fin and the isolation regions;

recessing a source/drain region of the fin, wherein recessing the source/drain region comprises forming an opening in the masking portions, and removing portions of the fin and the isolation regions proximate the masking portions; and epitaxially growing an epitaxial source/drain in the source/drain region, the epitaxial source/drain having a first portion with a first width proximate the substrate, a second portion with a second width distal from the substrate, and a third portion with a third width between the first portion and the second portion and proximate the opening in the masking portions, the third width being less than each of the first width and the second width.

16. The method of claim 15 further comprising:

forming a dielectric layer over the epitaxial source/drain;

forming an opening through the dielectric layer to the epitaxial source/drain; and forming a semiconductor-metal compound on the first portion of the epitaxial source/drain, the second portion of the epitaxial source/drain, and the third portion of the epitaxial source/drain by reacting a metal with the epitaxial source/drain through the opening.

17. The method of claim 15, wherein the masking portions constrain the epitaxial growth of the epitaxial source/drain at the third portion of the epitaxial source/drain.

18. The method of claim 17 further comprising:

forming a gate structure over the fin; and forming a gate spacer along a sidewall of the gate structure, the gate spacer being formed simultaneously with the masking portions.

19. The method of claim 17 further comprising:

forming a dielectric layer over the epitaxial source/drain; and forming an opening through the dielectric layer to the epitaxial source/drain, the forming the opening comprising removing portions of the masking portions.

20. The method of claim 17 further comprising forming a dummy layer on the opposing sidewalls of the fin, the masking portions being formed on the dummy layer.

* * * * *